United States Patent [19]

Chang

[11] Patent Number: 5,068,699
[45] Date of Patent: Nov. 26, 1991

[54] THIN FILM TRANSISTOR FOR A PLATE DISPLAY

[75] Inventor: Kyujeong Chang, Suwon, Rep. of Korea

[73] Assignee: Samsung Electronics Co., Ltd., Suwon, Rep. of Korea

[21] Appl. No.: 451,259

[22] Filed: Dec. 15, 1989

[51] Int. Cl.$^5$ .................. H01L 27/12; H01L 27/01; H01L 23/48

[52] U.S. Cl. ................................. 357/23.7; 357/4; 357/71

[58] Field of Search ................ 357/23.7, 4, 71

[56] References Cited

U.S. PATENT DOCUMENTS 4,469,568 9/1984 Kato et al. ............... 357/23.7

FOREIGN PATENT DOCUMENTS 0048911 11/1989 European Pat. Off. .......... 357/23.7
0114263 5/1988 Japan ............................ 357/23.7

Primary Examiner—Rolf Hille
Assistant Examiner—Wael Fahmy
Attorney, Agent, or Firm—Christie, Parker & Hale

[57] ABSTRACT

There is disclosed a thin film transistor for a plate display comprising first and second gates of different metals stacked one on top of the other on a glass substrate, a first insulating layer of tantalum oxide film formed on top of said second gate, second and third insulating layers of silicon dioxide formed successively on the first insulating layer and a semiconductor layer deposited on said third insulating layer.

2 Claims, 2 Drawing Sheets

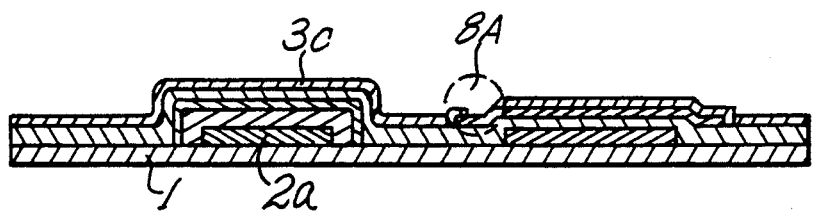
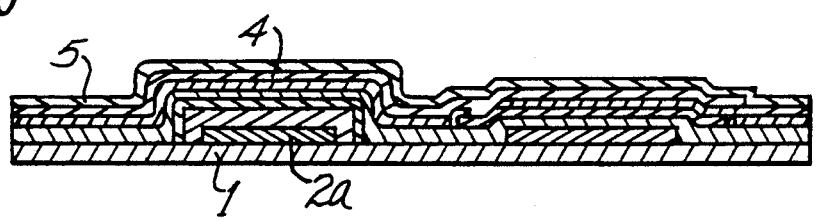
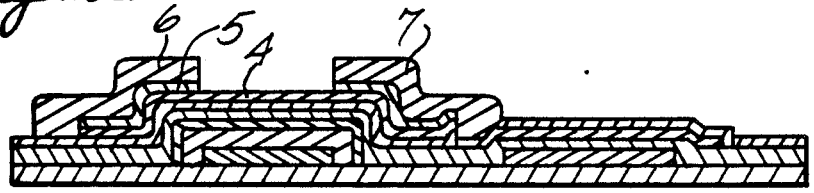
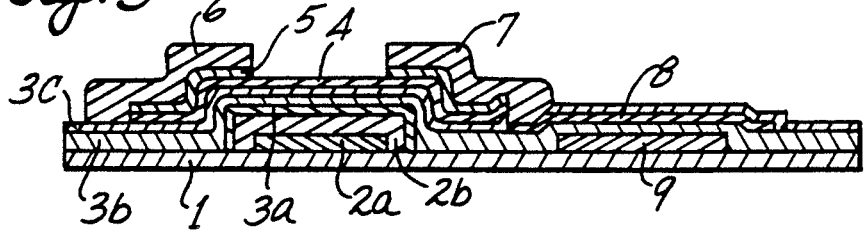

THIN FILM TRANSISTOR FOR A PLATE DISPLAY

BACKGROUND OF THE INVENTION

The present invention concerns a thin film transistor used as a switching element for a plate display.

Generally, a thin film transistor is used as a switching element for an active matrix plate display, since it realizes low driving voltage, low power consumption, light weight and high quality imaging. Such a thin film transistor will be briefly described with reference to FIG. 1.

A thin film transistor of prior art comprises a gate 2 formed on a glass substrate 1, gate insulating layers 3a and 3b formed on said gate, a semiconductor layer 4 formed on said gate insulating layers, ohmic layer 5 formed on said semiconductor layer, source and drain 6 and 7 connected to said semiconductor layer 4 with said ohmic layer 5 therebetween, and pixel electrode 8 formed on said gate insulating layer 3b contacting said drain 7.

In such a thin film transistor of prior art, there exist pin holes in the gate 2, so that the source and drain 6 and 7 are short-circuited under applied voltage. Moreover, many photolithographic etching steps are required for producing the thin film transistor, thus resulting in low yield rate. Hence, it does not properly function as a switching element for a plate display.

SUMMARY OF THE INVENTION

It is an object of the present invention to prevent short circuit of the drain and source of the thin film transistor by eliminating the pin holes in the gate.

It is another object of the present invention to provide a method for preparing a thin film transistor for a plate display which has multiple gates and multiple insulating layers.

According to the present invention, a thin film transistor comprises a first gate of a metal thin film formed on a glass substrate, a second gate of another metal thin film formed on said first gate to eliminate pin holes, at least two gate insulating layers formed on said gates, and a semiconductor layer formed on said insulating layers, whereby leakage current is prevented.

BRIEF DESCRIPTION OF THE DRAWINGS

FIG. 3 illustrates the construction of a thin film transistor for a plate display according to the present invention.

DETAILED DESCRIPTION OF THE INVENTION

The present invention will now be described more specifically with reference to the drawings attached only by way of example.

Referring to FIG. 3, a thin film transistor of the present invention comprises first and second gates 2a and 2b of different metals stacked one on top of the other on a glass substrate 1, first, second and third insulating layer 3a, 3b and 3c formed one on top of another on said second gate, and a semiconductor layer 4 deposited on said third insulating layer.

Now, the process for producing the inventive thin film transistor will be described with reference to FIG. 2.

Figure 1:
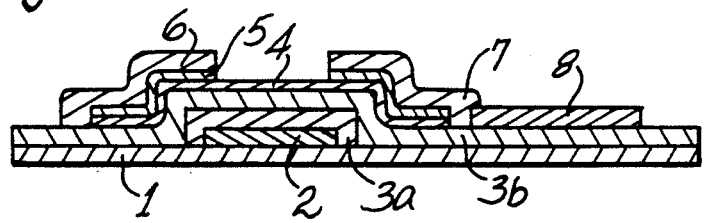
FIG. 1 illustrates the construction of a thin film transistor of prior art.
Figure 2A:
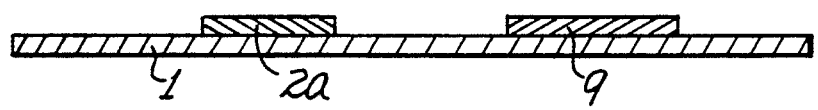
FIG. 2 illustrates the processing steps for producing a thin film transistor according to the present invention.
Figure 2B:
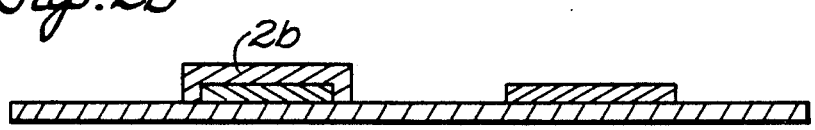
Figure 2C:
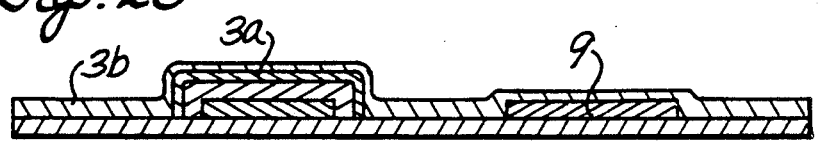

A glass substrate 1 coated with a transparent conducting film of indium tin oxide (ITO) is employed, as shown in FIG. 2A, to form the first gate 2a and storage capacitor 9. On the first gate 2a is deposited the second gate 2b of tantalum (Ta) film having the thickness of about 3000 Å by sputtering, as shown in FIG. 2B. On the second gate 2b is formed the first gate insulating layer 3a of tantalum oxide ($Ta_2O_5$) by anodic coating. On the first gate insulating layer is formed the second gate insulating layer 3b of $SiO_2$ to the thickness of 1000–3000 Å by plasma assisted chemical vapour deposition (PACVD), as shown in FIG. 2C.

Figure 2D:
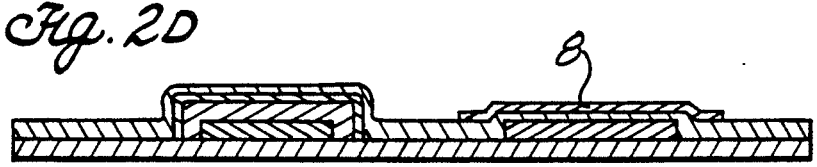

On the second gate insulating layer 3b is formed pixel electrode 8, which in turn is coated with the third gate insulating layer 3c of $SiO_2$ having the thickness of about 3000 Å, as shown in FIG. 2D. Thereafter, contact portion 8A is formed, as shown in FIG. 2E, so as to contact source 6, drain 7 and pixel electrode 8 with each other. On the third silicon semiconductor layer 4 having the thickness of 3000 Å and ohmic layer 5 by PACVD, as shown in FIG. 2F.

Finally, on the ohmic layer 5 plasma-etched ohmic layer 5 is deposited Al or Cr to the thickness of 3000–5000 Å by sputtering, which is patterned to form the source 6 and drain 7.

Thus, the short circuit of the source 6 and drain 7 is readily prevented by the inventive method, because the pin holes generated in the first gate 2a is eliminated by depositing the second gate 2b. Additionally, the triple insulating layers reduce the leakage current at maximum, thus improving the yield rate. Hence, the thin film transistor thus obtained may be properly used for a switching element of a plate display.

What is claimed is:

1. A thin film transistor for a plate display comprising first and second gates (2a and 2b) of different materials stacked one on top of the other, and a storage capacitor (9) on a glass substrate (1), the first gate (2a) comprising indium tin oxide and the second gate (2b) comprising tantalum, the capacitor (9) having an electrode of indium tin oxide, first, second and third insulating layers (3a, 3b and 3c) formed one on top of another on said second gate, the first insulating layer comprising $Ta_2O_5$ and a semiconductor layer (4) deposited on said third insulating layer.

2. A thin film transistor as recited in claim 1, wherein the second and third insulating layers comprise silicon dioxide.

* * * * *